(12) United States Patent
Yanagi et al.

(10) Patent No.: US 7,796,087 B2
(45) Date of Patent: Sep. 14, 2010

(54) ANTENNA APPARATUS HAVING A GROUND PLATE AND FEEDING UNIT

(75) Inventors: Masahiro Yanagi, Shinagawa (JP); Shigemi Kurashima, Shinagawa (JP); Hiroto Inoue, Shinagawa (JP); Takuya Uchiyama, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 0 days.

(21) Appl. No.: 11/783,216

(22) Filed: Apr. 6, 2007

(65) Prior Publication Data

US 2007/0182642 A1    Aug. 9, 2007

Related U.S. Application Data

(63) Continuation of application No. 11/119,732, filed on May 3, 2005, now Pat. No. 7,289,070.

(30) Foreign Application Priority Data

Sep. 17, 2004    (JP) ............................... 2004-271580

(51) Int. Cl.
    *H01Q 1/24* (2006.01)
(52) U.S. Cl. ............................... 343/702; 343/700 MS
(58) Field of Classification Search .......... 343/700 MS, 343/846, 848, 702
    See application file for complete search history.

(56) References Cited

U.S. PATENT DOCUMENTS

| | | | |
|---|---|---|---|
| 5,872,546 A | 2/1999 | Ihara et al. | 343/795 |
| 6,232,923 B1 * | 5/2001 | Guinn et al. | 343/700 MS |
| 6,259,418 B1 | 7/2001 | Jones et al. | 343/846 |
| 6,419,506 B2 | 7/2002 | Jones et al. | 439/131 |
| 6,642,892 B2 * | 11/2003 | Masaki et al. | 343/702 |
| 6,774,853 B2 * | 8/2004 | Wong et al. | 343/700 MS |
| 6,879,849 B2 * | 4/2005 | Begic | 455/575.7 |
| 6,906,677 B2 * | 6/2005 | Yamamoto et al. | 343/789 |
| 6,937,192 B2 * | 8/2005 | Mendolia et al. | 343/700 MS |
| 6,943,734 B2 * | 9/2005 | Zinanti et al. | 343/700 MS |
| 6,992,627 B1 * | 1/2006 | Honda et al. | 343/700 MS |
| 6,995,722 B2 | 2/2006 | Komatsu et al. | 343/711 |
| 7,057,563 B2 * | 6/2006 | Cox et al. | 343/700 MS |

(Continued)

FOREIGN PATENT DOCUMENTS

JP    9-223921    8/1997

(Continued)

OTHER PUBLICATIONS

Takuya Taniguchi, et al., "An Omnidirectional and Low-VSWR Antenna for the FCC-Approved UWB Frequency Band", The Institute of Electronics, Information and Communication Engineers, B-1-133, p. 133, 2003.

(Continued)

*Primary Examiner*—HoangAnh T Le
(74) *Attorney, Agent, or Firm*—Staas & Halsey LLP

(57) ABSTRACT

An antenna apparatus is disclosed. The antenna apparatus is structured by a ground plate that is shaped like a plate, and a feeding unit that is formed by a plate-like member, the feeding unit extending from the ground plate generally perpendicular to the ground plate at a predetermined angle to the ground plate for a predetermined length.

3 Claims, 13 Drawing Sheets

U.S. PATENT DOCUMENTS

| | | | |
|---|---|---|---|
| 7,075,483 B2 | 7/2006 | Okado | 343/700 MS |
| 7,158,089 B2* | 1/2007 | Mohammadian et al. | 343/795 |
| 7,289,069 B2* | 10/2007 | Ranta | 343/702 |
| 7,298,338 B2* | 11/2007 | Vesterinen | 343/702 |
| 7,365,692 B1* | 4/2008 | Su et al. | 343/702 |
| 7,375,700 B2* | 5/2008 | Hwang et al. | 343/906 |
| 2002/0190913 A1* | 12/2002 | Kuck | 343/846 |
| 2005/0233786 A1 | 10/2005 | Hatch | 455/575.7 |
| 2005/0248487 A1* | 11/2005 | Okado | 343/700 MS |
| 2006/0044205 A1* | 3/2006 | Lynch et al. | 343/833 |
| 2006/0071858 A1* | 4/2006 | Suh | 343/700 MS |
| 2006/0114159 A1* | 6/2006 | Yoshikawa et al. | 343/702 |

FOREIGN PATENT DOCUMENTS

| | | |
|---|---|---|
| JP | 2002-271116 | 9/2002 |
| JP | 2002-353726 | 12/2002 |
| JP | 2003-87022 | 3/2003 |
| JP | 2004-7460 | 1/2004 |
| JP | 2004-194331 | 7/2004 |
| JP | 2005-252526 | 9/2005 |
| WO | 2004/054035 A1 | 6/2004 |

OTHER PUBLICATIONS

Communication from the Japanese Patent Office mailed on Aug. 11, 2009 in the related Japanese patent application No. 2004-271580.

Office communication mailed from the United States Patent and Trademark Office on Jul. 5, 2006 in the related U.S. Appl. No. 11/119,732.

Office communication mailed from the United States Patent and Trademark Office on Nov. 16, 2006 in the related U.S. Appl. No. 11/119,732.

Office communication mailed from the United States Patent and Trademark Office on Mar. 27, 2007 in the related U.S. Appl. No. 11/119,732.

Office communication mailed from the United States Patent and Trademark Office on Jun. 13, 2007 in the related U.S. Appl. No. 11/119,732.

Communication from the Japanese Patent Office mailed on Feb. 16, 2010 in the related Japanese patent application No. 2007-230287.

Communication from the Japanese Patent Office mailed on Mar. 9, 2010 in the related Japanese patent application No. 2004-271580.

* cited by examiner

FIG.2
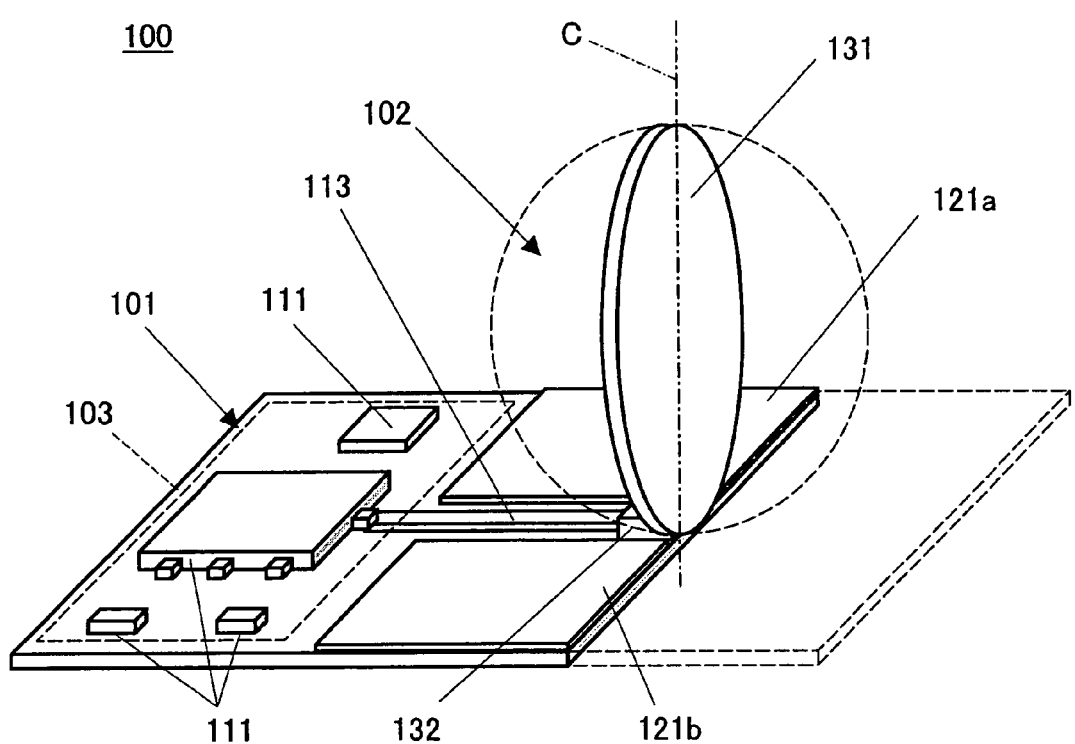
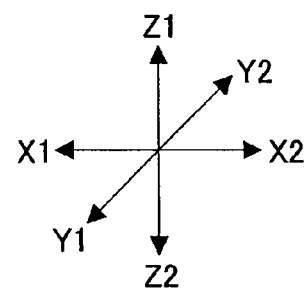

ANTENNA APPARATUS HAVING A GROUND PLATE AND FEEDING UNIT

CROSS-REFERENCE TO RELATED APPLICATIONS

This application is a continuation of U.S. application Ser. No. 11/119,732, filed May 3, 2005, now U.S. Pat. No. 7,289,070, which further claims the benefit of priority of Japanese Patent Application No. 2004-271580 filed Sep. 17, 2004, the contents of which are incorporated herein by reference.

BACKGROUND OF THE INVENTION

1. Field of the Invention

The present invention generally relates to an antenna apparatus, and especially relates to an antenna apparatus that has a ground plate that is shaped like a plate, and a feeding unit that extends from the ground plate in a direction generally perpendicular to the ground plate at a predetermined offset angle for a predetermined length.

2. Description of the Related Art

In recent years and continuing, radio communications technology using UWB (ultra-wide band) attracts attention since radar positioning and communications with a large transmission capacity are possible. As for UWB, the U.S. FCC (Federal Communications Commission) allowed use of a 3.1-10.6 GHz band in 2002.

Communications at UWB are performed by sending a pulse signal using a wide frequency band. Accordingly, an antenna apparatus used for UWB has to be capable of receiving a wide band signal.

For UWB communications, at least in the 3.1-10.6 GHz frequency band approved by the FCC, an antenna apparatus consisting of a ground plate and a feeding unit is proposed (Non-patent Reference 1).

FIG. 1A shows a structure of a conventional antenna apparatus 10.

The antenna apparatus 10 shown in FIG. 1A includes a feeding unit 12 installed on a ground plate 11, the feeding unit 12 being shaped like an inverted cone.

In addition, the inverted cone that constitutes the feeding unit 12 is set up so that its side may form an angle θ to an axis 13 that perpendicularly intersects the ground plate 11. A desired property is obtained by the angle θ.

An antenna apparatus 20 shown in FIG. 1B includes a feeding unit 22 in the shape of a teardrop that includes an inverted cone 22a, and a sphere 22b inscribed in the inverted cone 22a on the ground plate 11.

"An Omnidirectional and Low-VSWR Antenna for the FCC-Approved UWB Frequency Band", Takuya Taniguchi and Takehiko Kobayashi (Tokyo Denki University) (Announced on Mar. 22, 2003 at classroom B201) The Electronic Information Communication Society 2003 B-1-133.

However, since the conventional wideband-antenna apparatus is structured by the feeding unit having one of the inverted cone shape and the teardrop shape on the ground plate, the dimensions tend to be great. Then, an antenna apparatus that is smaller and thinner is desired.

SUMMARY OF THE INVENTION

Accordingly, a general object of the present invention is to provide an antenna apparatus that is small and thin, substantially obviating one or more of the problems caused by the limitations and disadvantages of the related art.

Features and advantages of the present invention are set forth in the description that follows, and in part will become apparent from the description and the accompanying drawings, or may be learned by practice of the invention according to the teachings provided in the description. Objects as well as other features and advantages of the present invention will be realized and attained by an antenna apparatus particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides the antenna apparatus as follows.

An aspect of the present invention provides the antenna apparatus including a ground plate that is shaped like a plate, and a feeding unit that extends from the ground plate in a direction that intersects perpendicularly with the ground plate for a predetermined length in a predetermined angle, wherein the feeding unit is shaped like a plate.

According to another aspect of the present invention, an upper part of the plate constituting the feeding unit is sliced and removed, the upper part opposing the ground plate.

According to another aspect of the present invention, the feeding unit is installed with its face being slanted relative to the ground plate.

According to another aspect of the present invention, the feeding unit is installed such that it can rotate in directions parallel to the ground plate (about an axis perpendicular to the ground plate).

According to another aspect of the present invention, the feeding unit is attached to the ground plate.

According to another aspect of the present invention, the ground plate and the feeding unit are structured by a pattern for the ground plate and a pattern for the feeding unit, respectively, formed on a flexible printed wiring board, wherein the part of the pattern for the feeding unit is bent in reference to the part of the pattern for the ground plate such that the feeding unit is structured as extending from the ground plate perpendicular to the ground plate for a predetermined length.

As described above, according to the present invention, since the feeding unit is structured by a plate that extends from the ground plate, the antenna apparatus can be made small and thin.

BRIEF DESCRIPTION OF THE DRAWINGS

FIG. 2 is a perspective diagram of the first embodiment of the present invention;

DETAILED DESCRIPTION OF THE PREFERRED EMBODIMENTS

In the following, embodiments of the present invention are described with reference to the accompanying drawings.

Figure 1A:
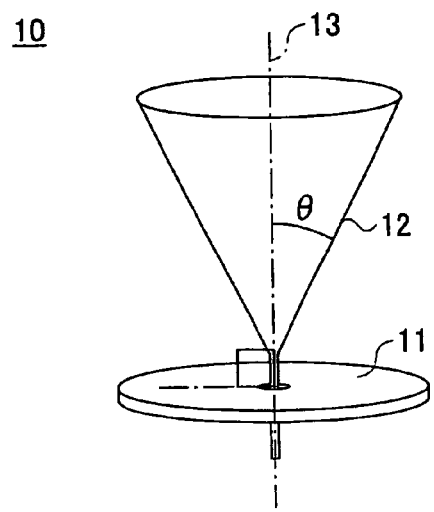
FIGS. 1A and 1B are block diagrams of examples of conventional antenna apparatuses.
Figure 1B:
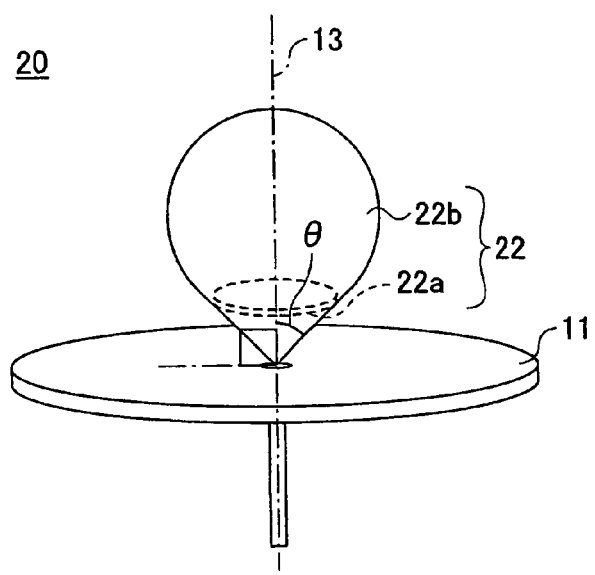
Figure 3:
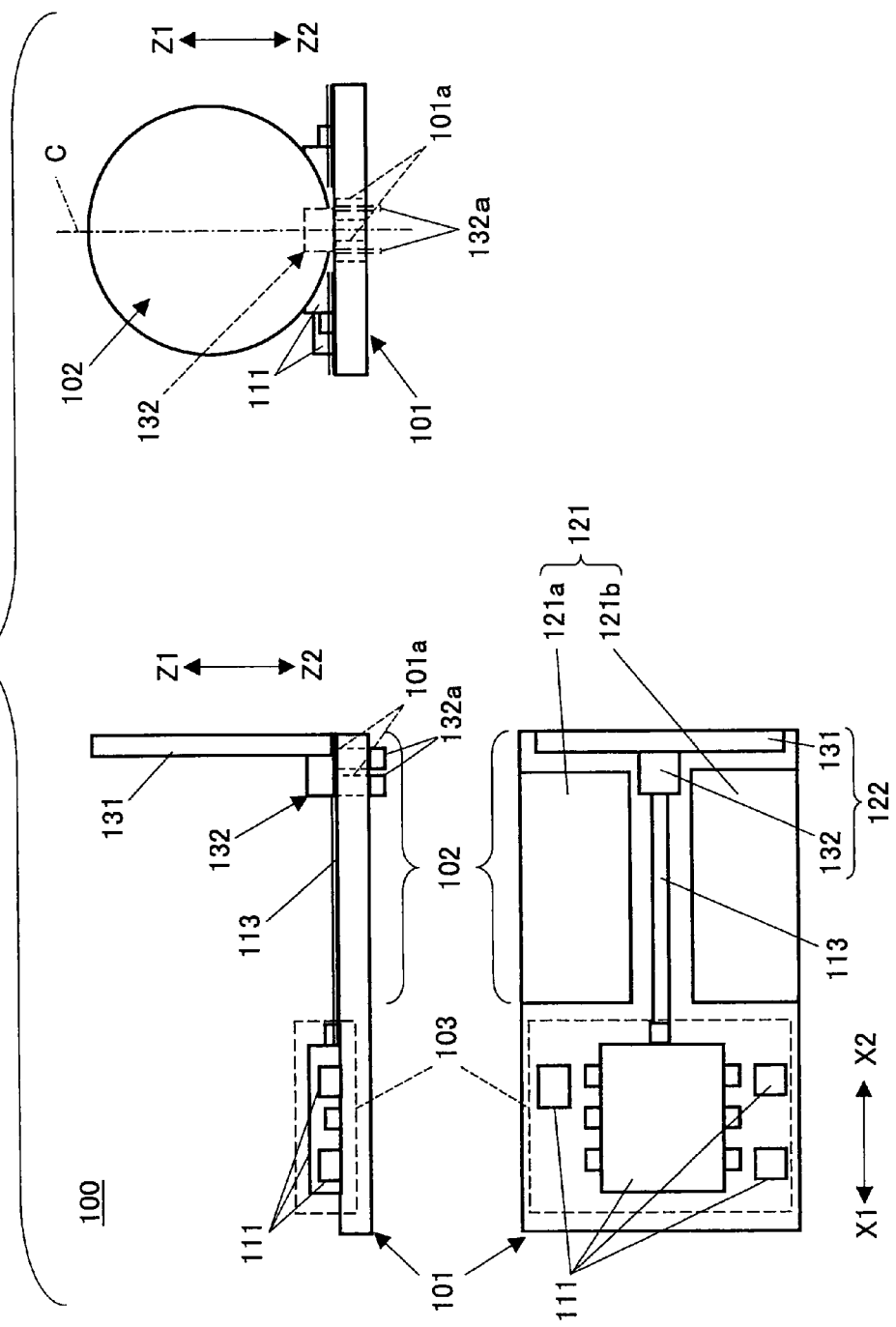
FIG. 3 is an orthographic projection of the first embodiment of the present invention.

FIG. 2 is a perspective diagram of an antenna apparatus 100 according to the first embodiment of the present invention, and FIG. 3 is an orthographic projection thereof.

The antenna apparatus 100 of the present embodiment includes a printed wiring board 101, an antenna unit 102, and an RF circuit unit 103.

The printed wiring board 101 is made from dielectrics such as resin and ceramics, for example, FR-4, and CEM3, on the surface of which electronic parts 111 are mounted. The electronic parts 111 mounted on the printed wiring board 101 are connected by an electrically conductive pattern 112 (illustration omitted), and constitute the RF circuit unit 103. The RF circuit unit 103 is connected to the antenna unit 102 by a microstrip line 113 formed on the printed wiring board 101.

The antenna unit 102 includes a ground plate 121 and the feeding unit 122.

The ground plate 121 is constituted by electrically conductive patterns 121a and 121b formed on the printed wiring board 101. The electrically conductive patterns 121a and 121b are connected to a grounding pattern.

The feeding unit 122 includes a feeding plate 131 and a fixing part 132. The feeding plate 131 is made by fabricating a metal plate. Here, the shape of the feeding plate 131 is shown as nearly being a circle, which is approximately the same as the conventional cross-section of the feeding units 12 and 22 taken along a plane that contains the center axis of the feeding units 12 and 22. The feeding plate 131 may be shaped in any form, such as a teardrop and a circle, so long as it can transmit and receive an electric wave of a desired frequency band.

When the feeding plate 131 is designed for communications at a frequency between 3.1 and 10.6 GHz that is the frequency band of UWB, the angle θ (see FIG. 5) of the periphery section to the centerline C is set at between 40° and 80°, and the height H is set at about 25 mm. Here, the height H is set at approximately λ/4 of the minimum frequency used for transmission and reception. For example, if the frequency between 3.1 and 10.6 GHz should be covered, λ is set at the wavelength corresponding to 3.1 GHz.

Further, the width W of the ground plate 121 is set up so that ground plate 121 may become slightly greater than the bottom shape of the feeding plate 122 in the width W directions.

By setting up as described above, the peak value of VSWR can be made smaller than 3.0 in the 3.1-10.6 GHz range that is the frequency band of UWB.

The fixing part 132 is formed at the lower part of the feeding plate 131, and at the end in the direction indicated by arrow Z2 by welding, or by fabricating in one body with the feeding plate 131. The fixing part 132 has nail sections 132a that extend in the arrow Z2 direction. The nail sections 132a are placed into respective through-holes 101a formed on the printed wiring board 101 at end in the direction indicated by arrow X2, are bent onto the rear surface of the printed wiring board 101 in the arrow Z2 direction, and are fixed to the printed wiring board 101 by soldering. In this manner, the feeding plate 131 is arranged straight up in the arrow Z1 direction, and fixed to the printed wiring board 101.

The fixing part 132 is soldered to the printed wiring board 101 at the end of the microstrip line 113 formed on the printed wiring board 101. The microstrip line 113 is formed in the directions of the arrows X1 and X2 between the electrically conductive patterns 121a and 121b. The other edge of the microstrip line 113 is connected to the RF circuit unit 103.

According to this embodiment, the feeding unit 121 is made small and thin as compared with the conventional case where the feeding unit is structured by an inverted cone. Accordingly, the antenna apparatus 100 can be made small and thin.

Figure 4:
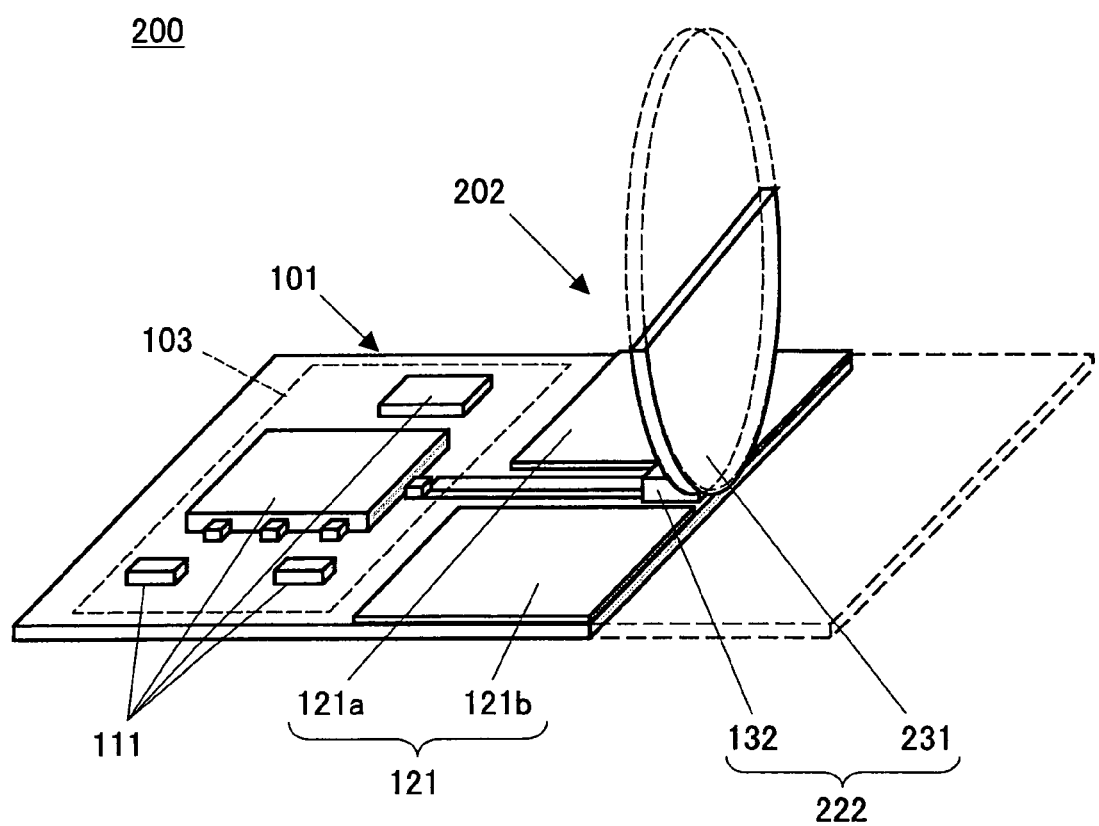
FIG. 4 is a perspective diagram of the second embodiment of the present invention.
Figure 5:
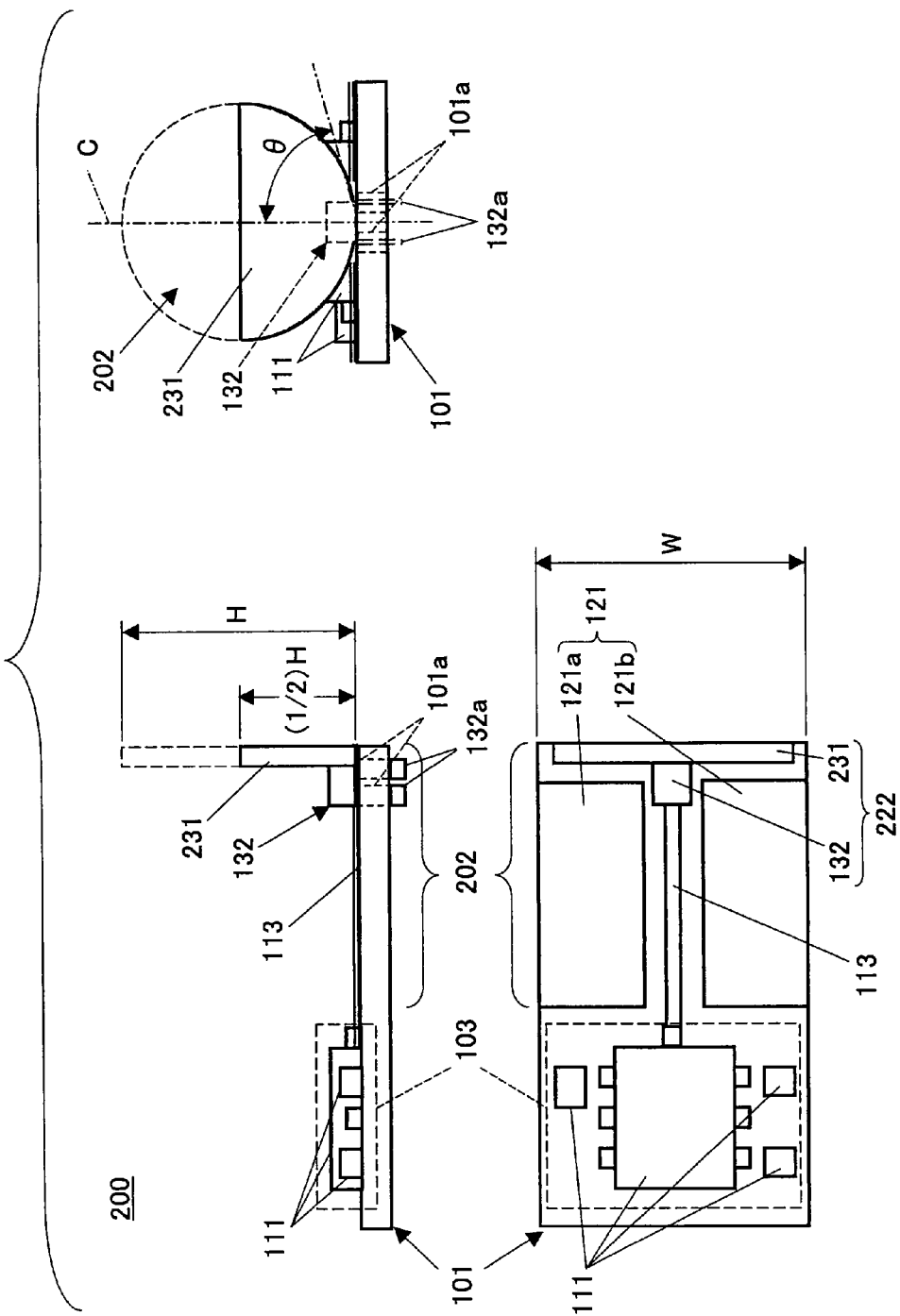
FIG. 5 is an orthographic projection of the second embodiment of the present invention.

FIG. 4 is a perspective diagram of an antenna apparatus 200 according to the second embodiment of the present invention, and FIG. 5 is an orthographic projection thereof. The same reference numbers are given to the components the same as FIG. 2 and FIG. 3, and the explanation thereof is not repeated.

The antenna apparatus 200 includes an antenna unit 202 that is different from the antenna unit 102 of the first embodiment. The antenna unit 202 of the second embodiment includes a feeding unit 222 that is different from the feeding unit 122 of the first embodiment.

The feeding unit 222 of the second embodiment includes a feeding plate 231 that is made into the form where the plane form of the feeding plate 131 (of the first embodiment) is cut at about one-half height H/2.

Since the height of the feeding plate 231 is about a half of the first embodiment, the feeding unit 202, and therefore the antenna apparatus 200, can be made even thinner.

Figure 6:
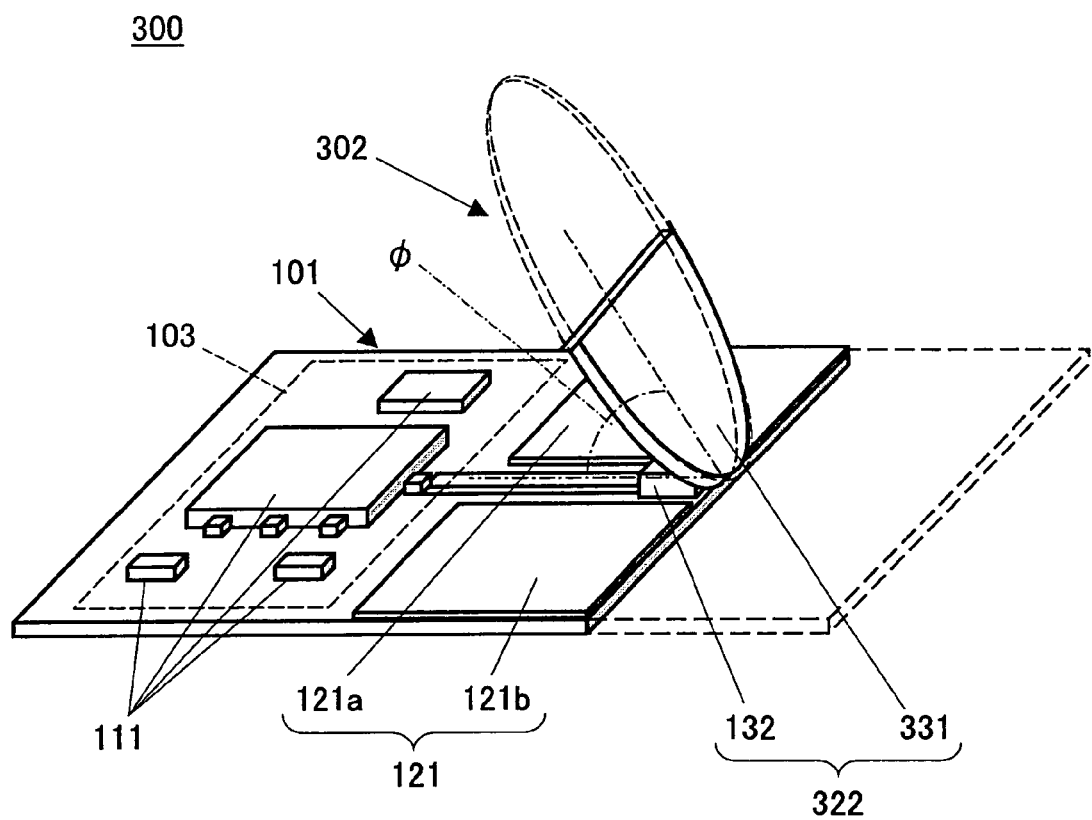
FIG. 6 is a perspective diagram of the third embodiment of the present invention.
Figure 7:
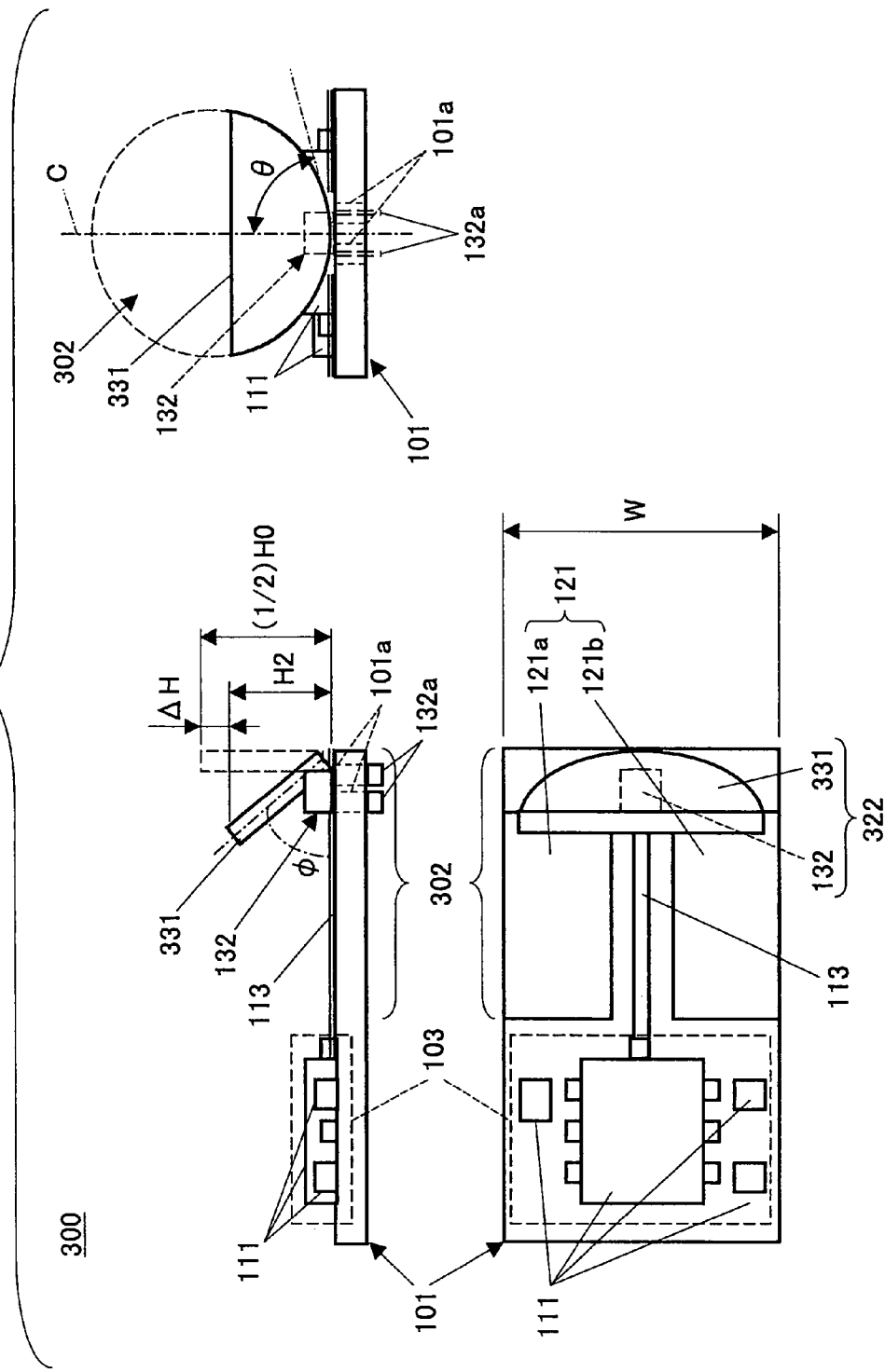
FIG. 7 is an orthographic projection of the third embodiment of the present invention.

FIG. 6 is a perspective diagram of an antenna apparatus 300 according to the third embodiment of the present invention, and FIG. 7 is an orthographic projection thereof. The same reference numbers are given to the components the same as FIG. 4 and FIG. 5, and the explanation thereof is not repeated.

The antenna apparatus 300 of this embodiment includes an antenna unit 302 that is different from antenna unit 202 of the second embodiment. Further, the antenna unit 302 of this embodiment includes a feeding unit 322 that is different from the feeding unit 222 of the second embodiment.

The feeding unit 322 of this embodiment include a feeding plate 331 that is arranged not perpendicular to the printed wiring board 101, but at an angle φ.

In other words, the feeding plate 331 is arranged inclining to the fixing part 132 at the angle φ.

According to this embodiment, the height H2 of the antenna apparatus 300 is lower than the height of the antenna apparatus 200 of the second embodiment by ΔH corresponding to the inclination. In addition, the height ΔH is expressed as follows.

$$\Delta H = H0/2 - \{(H/2) \times \sin \phi\}$$

Therefore, according to this embodiment, the feeding plate 331 is arranged with a lower profile than H0/2, and the antenna apparatus 300 can be made further thinner.

Figure 8:
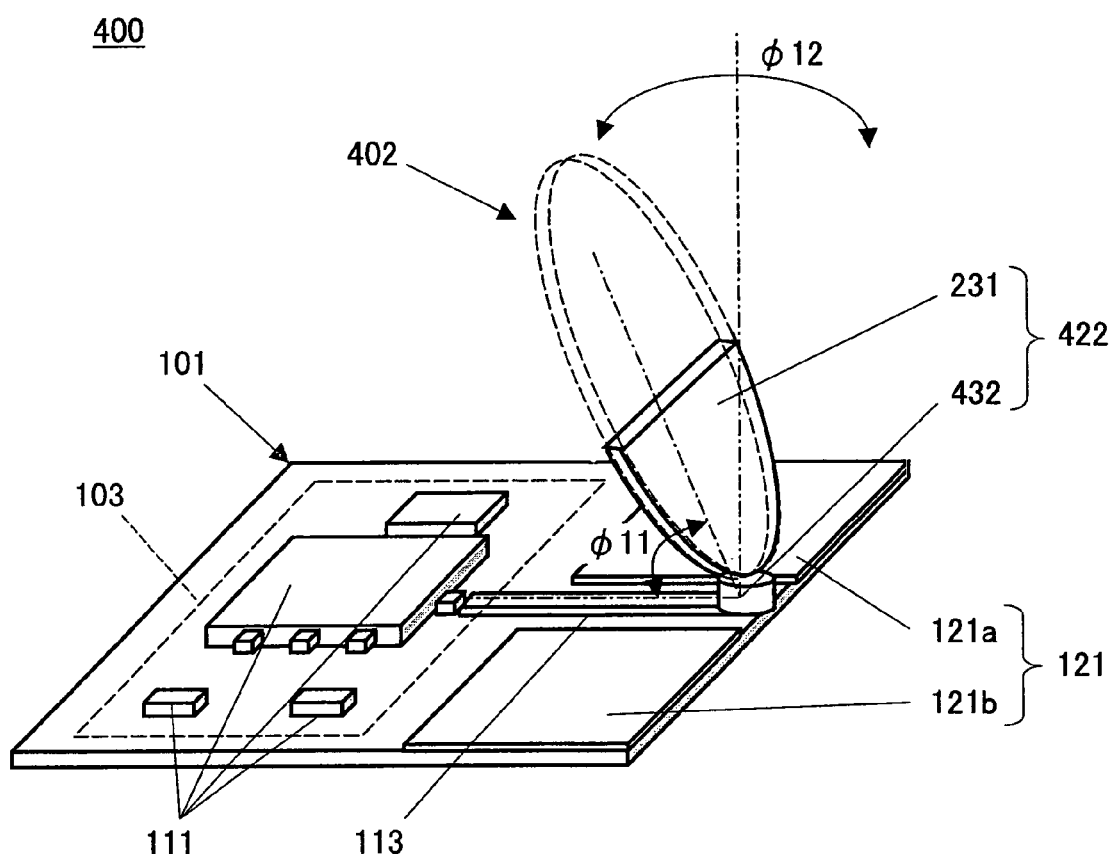
FIG. 8 is a perspective diagram of the fourth embodiment of the present invention.
Figure 9:
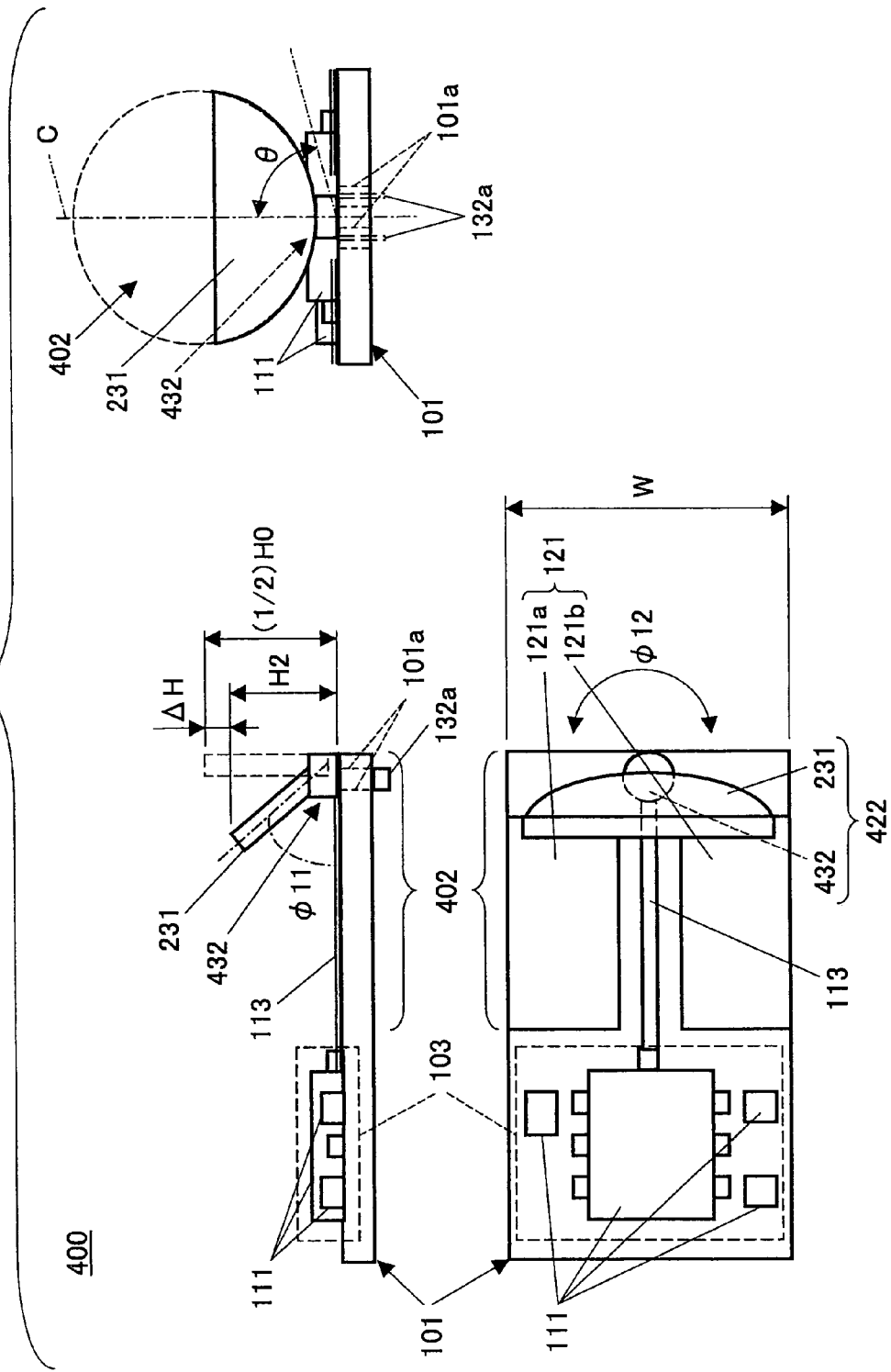
FIG. 9 is an orthographic projection of the fourth embodiment of the present invention.

FIG. 8 is a perspective diagram of an antenna apparatus 400 according to the fourth embodiment of the present invention, and FIG. 9 is an orthographic projection thereof. The same reference numbers are given to the components the same as FIG. 2 and FIG. 3, and the explanation there of is not repeated.

The antenna apparatus 400 of this embodiment includes an antenna unit 402 is different from the antenna unit 302 of the third embodiment. Further, the antenna unit 402 includes a feeding unit 422 that is different from the feeding unit 322 of the third embodiment. Furthermore, the feeding unit 422 of this embodiment includes a fixing part 432 that is different from fixing part 132 of the third embodiment.

The fixing part 432 of this embodiment holds the feeding plate 231 such that the feeding plate 231 can be rotated in the directions indicated by arrow φ11 and arrow φ12.

Figure 10:
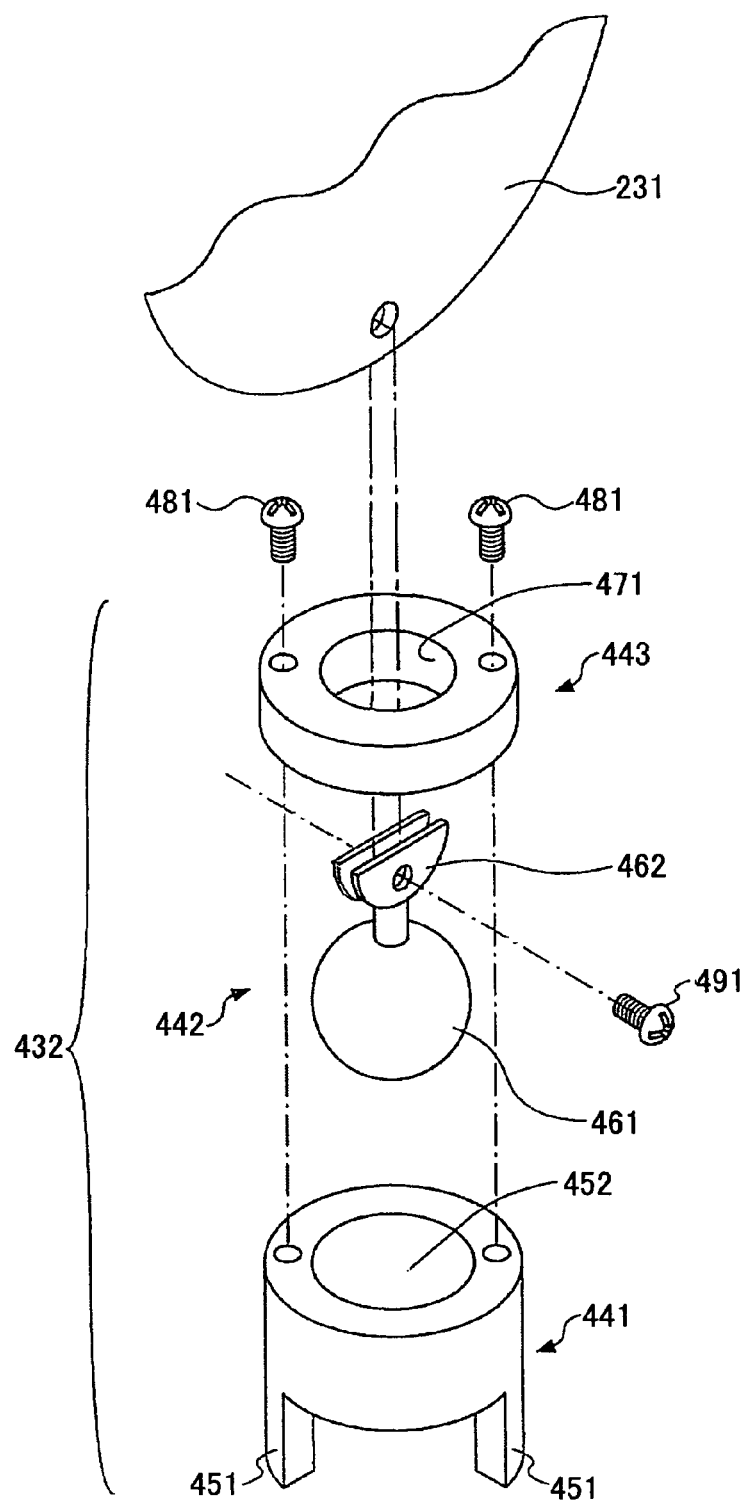
FIG. 10 is an exploded perspective diagram of a fixing part 432.

FIG. 10 is an exploded perspective diagram of the fixing part 432.

The fixing part 432 includes a base 441, a rotation section 442, and a supporting section 443.

The base 441 has nail sections 451 that penetrate the through hole 101a of the printed wiring board 101 like the fixing part 132, and are fixed by soldering. The base 441 has a concavity 452 that is formed approximately in the shape of a hemisphere.

The rotation section 442 includes a solid sphere section 461 and a feeding plate fixing section 462. The solid sphere section 461 engages with the concavity 452 of the base 441.

The supporting section 443 is formed approximately in the shape of a circular ring. The feeding plate fixing part 462 penetrates a hole 471 of the supporting section 443. The supporting section 443 is fixed to the base 441 with screws 481, and the like, such that the solid sphere section 461 of the rotation section 442 is supported rotation-free by the supporting section 443 and the base 441.

A feeding plate fixing part 462 is attached to the solid sphere section 461, and is rotationally moved according to the rotational movement of the solid sphere section 461. The tip of the feeding plate fixing part 462 is fixed to the feeding plate 231 with a screw 491.

In this manner, the feeding plate 231 is supported such that it can be rotationally moved in the directions shown by the arrows φ11 and φ12.

Since the feeding plate 231 is supported free to rotate as described above, the angle between the feeding plate 231 and the ground plate 121, and the like, can be adjusted according to the transmission/reception status. That is, by rotationally moving the feeding plate 231 in the directions of φ11 and φ12, alignment between the feeding plate 231 and the ground plate 121 and antenna directivity can be adjusted. Therefore, transmission and reception can be easily optimized.

In addition, after adjustment, the rotational position of the feeding plate 231 may be fixed by soldering the rotation section 442 to the base 441, and the like.

Figure 11:
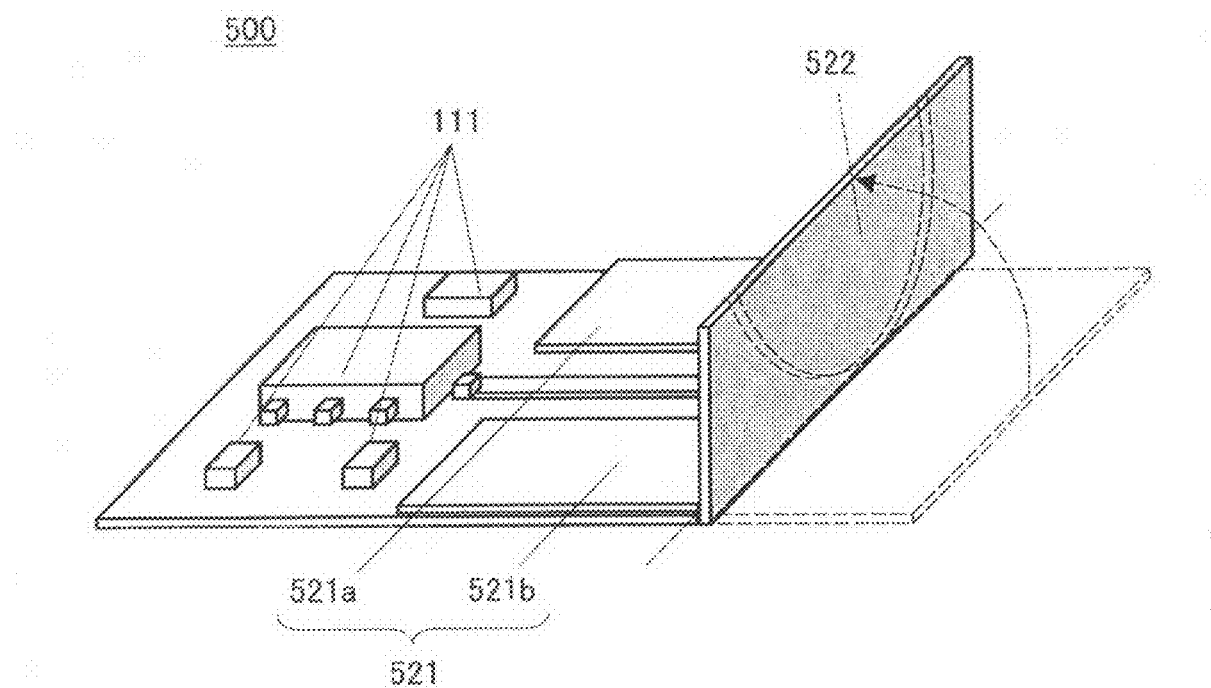
FIG. 11 is a perspective diagram of the fifth embodiment of the present invention.
Figure 12:
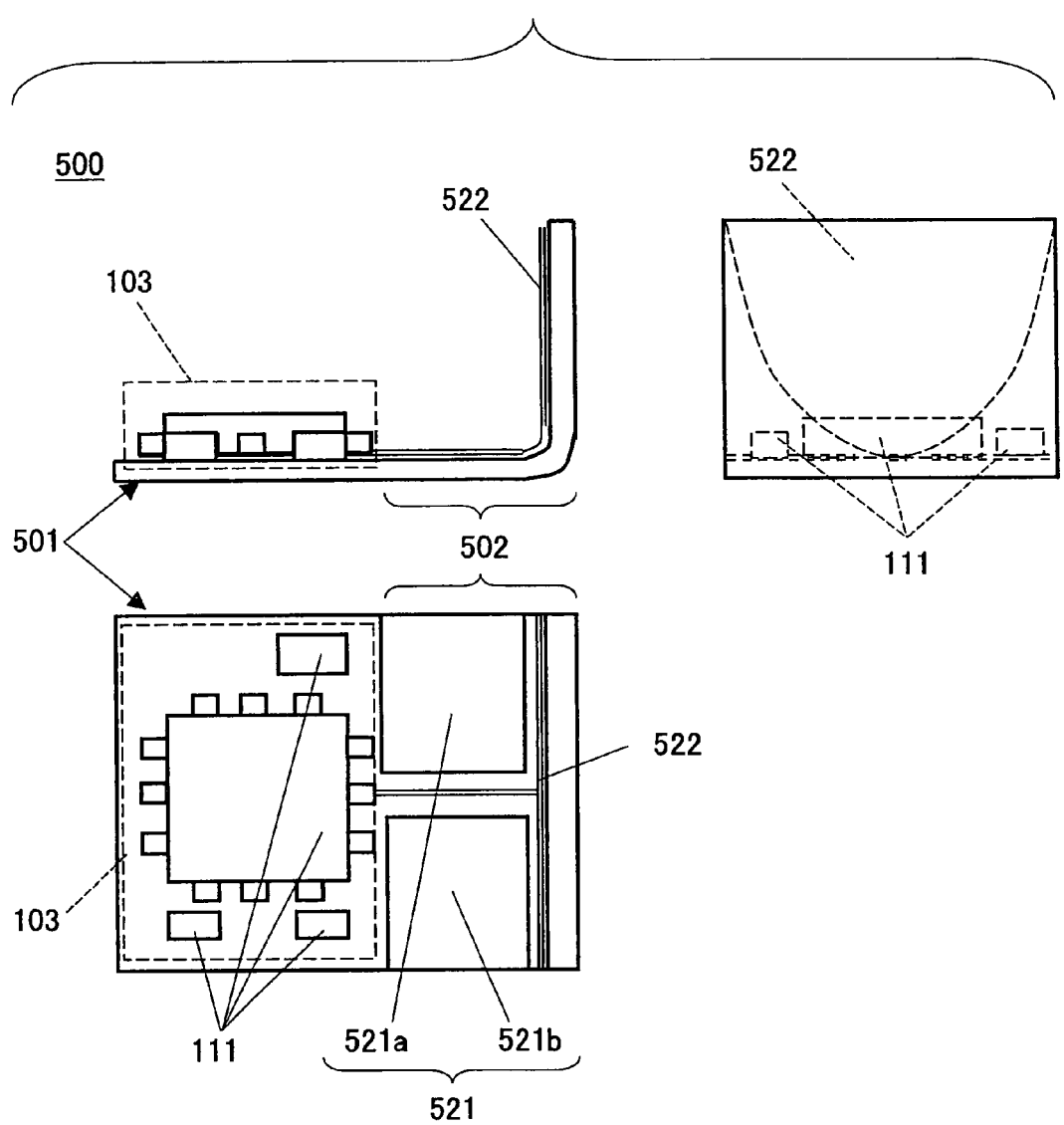
FIG. 12 is an orthographic projection of the fifth embodiment of the present invention.

FIG. 11 is a perspective diagram of an antenna apparatus according to the fifth embodiment of the present invention, and FIG. 12 is an orthographic projection thereof. The same reference numbers are given to the components the same as FIG. 2 and FIG. 3, and the explanation thereof is not repeated.

The antenna apparatus 500 of this embodiment includes an antenna unit 502 and the RF circuit unit 103 arranged on a flexible printed wiring board 501.

The flexible printed wiring board 501 is made of a flexible wiring substrate that can be bent, and mounts the electronic parts 111. The electronic parts 111 connected by electrically conductive patterns on the flexible printed wiring board 501 constitute the RF circuit unit 103. The RF circuit unit 103 is connected to the antenna unit 502 by the microstrip line 113 formed on the flexible printed wiring board 501.

The antenna unit 502 is constituted by an electrically conductive pattern formed on the flexible printed wiring board 501, and includes a ground plate 521 and a feeding unit 522.

The ground plate 521 is constituted by electrically conductive patterns 521a and 521b. The electrically conductive patterns 521a and 521b are connected to a grounding pattern.

The feeding unit 522 is constituted by an electrically conductive pattern 531 (not shown). The conductive pattern 531 serving as the feeding unit 522 is shaped like the cross-sectional form of the solid sphere portion of the conventional feeding unit 22 taken along the plane containing the center axis. In addition, the shape is like the cross-sectional form of the whole feeding unit 22 taken along the plane containing the center.

When the electrically conductive pattern 531 is designed for communications at a frequency between 3.1 and 10.6 GHz that is the frequency band of UWB, the angle θ of the periphery section to the centerline C is set at between 40° and 80° (see FIG. 7), and the height H0 is set at about 25 mm. Here, the height H0 is set at approximately λ/4 of the minimum frequency used for transmission and reception.

Further, at this time, the width W is set up so that ground plate 521 may become slightly greater than the bottom form of the feeding unit 522.

By setting up as described above, the peak value of VSWR can be made smaller than 3.0 in the 3.1-10.6 GHz range that is the frequency band of UWB.

Next, the manufacturing method of the antenna apparatus 500 of this embodiment is described.

Figure 13A:
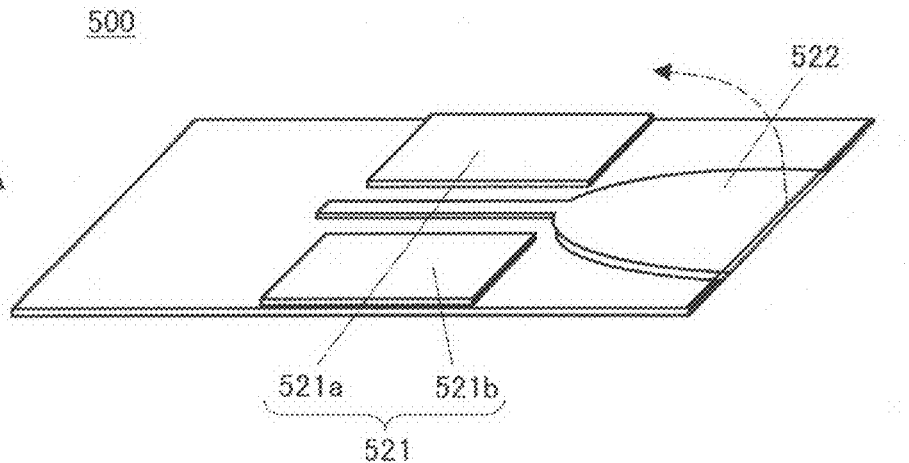
FIGS. 13A, 13B and 13C are perspective drawings for explaining a manufacturing method of an antenna apparatus 500.
Figure 13B:
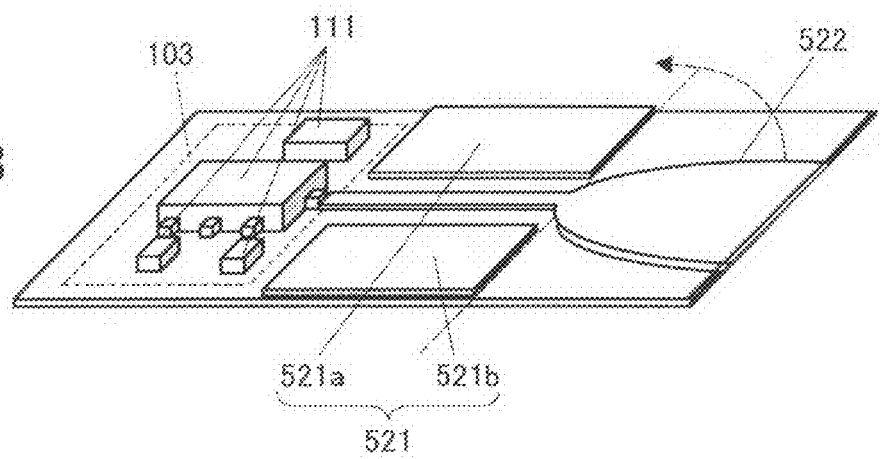
Figure 13C:
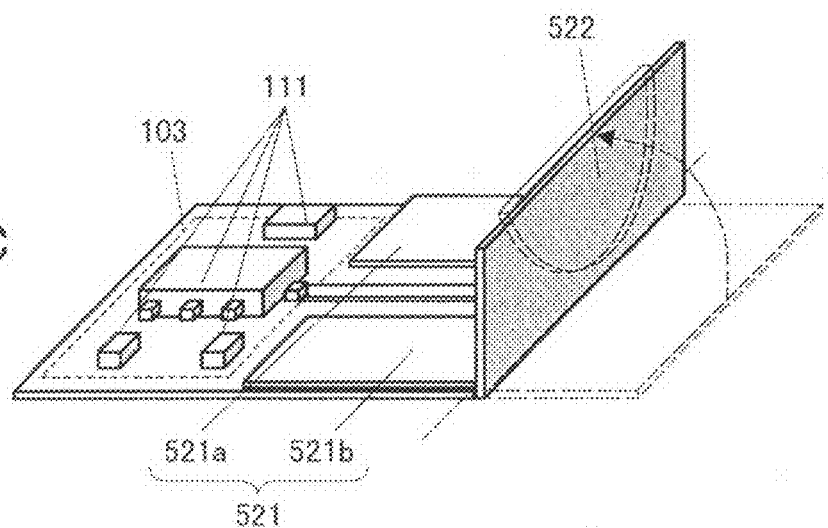

FIGS. 13A, 13B, and 13C are perspective drawings for explaining the manufacturing method of the antenna apparatus 500.

First, as shown in FIG. 13A, the electrically conductive patterns 521a and 521b serving as the ground plate 521, and the electrically conductive pattern 531 serving as the feeding unit 522, are formed on the flexible printed wiring board 501.

Next, the electronic parts 111 are mounted on the flexible printed wiring board 501 as shown by FIG. 13B.

Next, the flexible printed wiring board 501 is bent 90 degrees at the portion indicated by a chain line as shown in FIG. 13C.

In this manner, the antenna apparatus 500 as shown in FIG. 11 and FIG. 12 is completed.

According to this embodiment, the feeding unit 522 is made small and thin as compared with the conventional case where the shape of an inverted cone is used. Therefore, the antenna apparatus 500 can be made small and thin.

By molding the antenna apparatuses 100 through 500 described above by molding resin, the dimensions of the antenna apparatuses 100 through 500 can be further reduced, due to the wavelength compression effect.

Further, the present invention is not limited to these embodiments, but variations and modifications may be made without departing from the scope of the present invention.

The present application is based on Japanese Priority Application No. 2004-271580 filed on Sep. 17, 2004 with the Japanese Patent Office, the entire contents of which are hereby incorporated by reference.

What is claimed is:

1. An antenna apparatus, comprising:
a ground plate that is disposed on a printed wiring board, the printed wiring board being a flexible printed wiring board; and
a feeding unit that includes a feeding plate and is disposed along the printed wiring board, wherein
a height at which the feeding plate extends above the printed wiring board is set at one-quarter of the minimum frequency used by the antenna apparatus for transmission and reception, and
an angle between a vertical center line of the feeding plate and a peripheral section of the feeding plate is set between forty degrees and eighty degrees.

2. The antenna apparatus of claim 1, further comprising a radio frequency circuit unit disposed on the printed wiring board and connected to the feeding unit by a microstrip line.

3. An antenna apparatus, comprising:

an antenna part having electrically conductive patterns formed on a plate-shaped board, the board being a flexible printed wiring board, wherein the antenna part includes a ground plate and a feeding unit, the feeding unit including a feeding plate, a height at which the feeding plate extends above the plate-shaped board is set at one-quarter of the minimum frequency used by the antenna apparatus for transmission and reception, and an angle between a vertical center line of the feeding plate and a peripheral section of the feeding plate is set between forty degrees and eighty degrees.

* * * * *